United States Patent [19]
Kamase

[11] Patent Number: 5,805,987
[45] Date of Patent: Sep. 8, 1998

[54] DOUBLE BALANCED MIXER CIRCUIT WITH LESS POWER CONSUMPTION

[76] Inventor: Fumihiro Kamase, c/o NEC Corporation, 7-1 Shiba 5-chome, Minato-ku, Tokyo, Japan

[21] Appl. No.: 718,176

[22] Filed: Sep. 19, 1996

[30] Foreign Application Priority Data

Nov. 10, 1995 [JP] Japan .................................. 7-317266

[51] Int. Cl.$^6$ .................................................. H04B 1/28
[52] U.S. Cl. ........................... 455/326; 455/333; 327/359
[58] Field of Search .................................... 455/323, 325, 455/326, 327, 330, 333, 317, 318, 319, 118, 119; 327/113, 355, 356, 357, 359

[56] References Cited

U.S. PATENT DOCUMENTS

| | | | |
|---|---|---|---|
| 4,058,771 | 11/1977 | Oshawa et al. | ........................ 455/333 |
| 5,548,840 | 8/1996 | Heck | ...................................... 455/326 |
| 5,630,228 | 5/1997 | Mittel | ..................................... 455/333 |

OTHER PUBLICATIONS

T. Tsukahara, et al., "A Low–Voltage 2–GHz Si–Bipolar Direct–Conversion Quadrature Modulator", Technical Report of IEICE, ICD94–61, 1994, pp. 23–30.

T. Tsukahara, et al., "WP 2.6: A 2V 2GHz Si–Bipolar Direct–Conversion Quadrature Modulator", 1994 IEEE International Solid–State Circuits Conference, pp. 40–41 and 306.

Primary Examiner—Thanh Cong Le
Attorney, Agent, or Firm—Ostrolenk, Faber, Gerb & Soffen, LLP

[57] ABSTRACT

A double balanced mixer circuit of reduced power consumption includes two single balanced mixer circuits each of which has a pair of first transistors. Output side terminals of the first transistors are cross-coupled between the two pairs, and first differential signals are supplied to control terminals of the first transistors. Connected in series to each pair of first transistors is a second transistor of a pair of second transistors. The double balanced mixer circuit also includes a differential amplifier circuit including a pair of third transistors, with fourth transistors connected to the pair of third transistors. The fourth transistors function as constant current sources for the pair of third transistors. Second differential signals are supplied to control terminals of the third transistors and differential output terminals of the third transistors are directly coupled to control terminals of the pair of second transistors.

16 Claims, 5 Drawing Sheets ial pairs of transistors (76) and (77); and (79) and (80) constitute two single balanced mixer circuits, respectively. The collectors of two differential pairs of transistors are cross-coupled to form a core section of the double balanced mixer circuit. Local differential signals are inputted to the bases of the corresponding transistors of the two differential pairs from local signal terminals $V_{LO}+$ (64) and $V_{LO}-$ (65). Baseband differential voltage signals are converted differential current signals by a differential amplifier which is composed of differential pair of transistors (68) and (69) whose emitters are connected to each other via an emitter resistance (88), and current mirror circuit which is composed of transistors (74) and (78); and (75) and (81). The differential amplifier includes constant current sources (70) and (71) and a current summation of the two single balanced mixer circuits is held at a constant value.
DOUBLE BALANCED MIXER CIRCUIT WITH LESS POWER CONSUMPTION

BACKGROUND OF THE INVENTION

1. Field of the Invention

The present invention relates to a double balanced mixer circuit, and more particularly to a double balanced mixer circuit of a direct-conversion quadrature modulator for transmitting a digital signal.

2. Description of Related Art

FIG. 1 shows an example of conventional double balanced mixer circuit of a direct-conversion quadrature modulator. The figure illustrates the structure of a current-folded type of double balanced mixer circuit which is composed only of NPN transistors and in which two transistors are stacked in a vertical direction. Referring to FIG. 1, differ- The structure of the conventional double balanced mixer circuit will be explained in more detail with reference to FIG. 1. In the following description, "a transistor Q3" means a third transistor. In the same way, "a resistor R8 (89)" means the eighth resistor 89 and the numeric value of "89" indicates a reference number in the figure. This is the same as in all the other figures.

One terminal of each of resistors R8 (89) and R9 (90) is connected to the ground terminal GND. The other terminals of the resistors R8 (89) and R9 (90) are connected to the emitters of NPN transistors Q3 (70) and Q4 (71), respectively. The bases of those transistors are together connected to a bias voltage terminal $V_B$ (61). The collector of the transistor Q3 (70) is connected to the emitter of an NPN transistor Q1 (68). The base of the transistor Q1 (68) is connected to a baseband signal $V_{BB}+$ terminal (62). The collector of the transistor Q4 (71) is connected to the emitter of an NPN transistor Q2 (69). The base of the transistor Q4 (71) is connected to the baseband signal terminal $V_{BB}-$ (63). A resistor R7 (88) is connected between the emitters of the transistors Q1 (68) and Q2 (69). The collector of the transistor Q1 (68) is connected to one terminal of a resistor R5 (86) and the collector of the transistor Q2 (69) is connected to one terminal of a resistor R6 (87). The other terminal of each of the resistors R5 (86) and R6 (87) is connected to a power supply voltage terminal Vcc (60). In this manner, the differential amplifier circuit is composed of the NPN transistors Q1 (68), Q2 (69), Q3 (70) and Q4 (71), and the resistors R8 (89), R9 (90), R7 (88), R5 (86) and R6 (87).

The collectors of NPN transistors Q6 (73) and Q5 (72) are together connected to the power supply voltage terminal Vcc (60). The base of the transistor Q5 (72) is connected to the collector of the transistor Q1 (68) and the base of the transistor Q6 (73) is connected to the collector of the transistor Q2 (69). The emitter of the transistor Q5 (72) is connected to the base and collector of an NPN transistor Q7 (74). Also, the emitter of the transistor Q6 (73) is connected to the base and collector of an NPN transistor Q8 (75). Thus, emitter follower circuits are added to the differential amplifier.

The emitter of a transistor Q7 (74) is connected to the ground terminal GND via a resistor R4 (85) and the emitter of the transistor Q8 (75) is connected to the ground terminal GND via a resistor R10 (91). The emitter of an NPN transistor Q11 (78) is connected to the GND terminal GND via a resistor R3 (84). The base of the transistor Q11 (78) is connected to the base and collector of the transistor Q7 (74). The collector of the transistor Q11 (78) is connected to the emitters of NPN transistors Q9 (76) and Q10 (77). The emitter of an NPN transistor Q14 (81) is connected to the ground terminal GND via a resistor R11 (92). The base of the transistor Q14 (81) is connected to the base and collector of the transistor Q8 (75). Thus, current mirror circuits are constituted.

The base of the transistor Q9 (76) is connected to the local signal terminal $V_{LO}+$ (64) and the base of the transistor Q10 (77) is connected to the local signal terminal $V_{LO}-$ (65). The collectors of the transistors Q9 (76) and Q10 (77) are connected to the power supply voltage terminal Vcc (60) via resistors R1 (82) and R2 (83), respectively. The collector of the transistor Q14 (81) is connected to the emitters of the NPN transistors Q12 (79) and Q13 (80). The base of the transistor Q12 (79) is connected to the local signal terminal $V_{LO}+$ (64) and the base of the transistor Q13 (80) is connected to the local signal terminal $V_{LO}-$ (65). The collectors of the transistor Q12 (79) and Q13 (80) are respectively connected to the collectors of the transistors Q10 (77) and Q9 (76) to form the above-mentioned cross-coupling.

By the above structure, the double balanced mixer circuit which has the two single balanced mixer circuits is constituted. Note that the above double balanced mixer circuit is described in references, for example, "A Low-Voltage 2-GHz Si-Bipolar Direct-Conversion Quadrature Modulator", (Technical Report of IEICE, ICD94-61, pp.23–30, 1994) and "A 2V 2 GHz Si-Bipolar Direct-Conversion Quadrature Modulator", (1994 IEEE International Solid-State Circuits Conference) by T. Tsukahara et al.

In the double balanced mixer circuit, the baseband differential signals are inputted from the $V_{BB}+$ terminal (62) and $V_{BB}-$ terminal (63) in the differential signal form and is amplified by the differential amplifier circuit which is composed of the NPN transistors Q1 (68) and Q2 (69). The output voltages of the differential amplifier are dropped by the above-mentioned two emitter follower circuits which are composed of the NPN transistors Q5 (72) and Q7 (74) and the resistors R4 (85); and the NPN transistor Q6 (73) and Q8 (75) and the resistor R10 (91) such that the baseband differential signals are inputted to the bases of the NPN transistors Q11 (78) and Q14 (81), respectively. On the other hand, the local differential signals are inputted from the $V_{LO}+$ terminal (64) and $V_{LO}-$ terminal (65) of each of the two single balanced mixer circuits in the same manner as above. The local differential signals and the baseband differential signals are mixed and amplified in a differential manner, by the differential pair of NPN transistors Q9 (76) and Q10 (77) and the NPN transistor Q11 (78) and the differential pair of NPN transistors Q12 (79) and Q13 (80) and the NPN transistor Q14 (81). As a result, the differential signals in each of which the local differential signal and the baseband differential signal are mixed are outputted from an output signal terminal $V_{OUT}-$ (66) and an output signal terminal $V_{OUT}+$ (67) of the double balanced mixer circuit.

As shown in FIG. 1, the conventional double balanced mixer circuit is composed only of the NPN transistors. This is based on the following reason. That is, because minority carriers traveling through the base area of a transistor are holes in a PNP transistor, the PNP transistor is inferior to an NPN transistor in high frequency characteristic. For this reason, the development of the PNP transistor for a very high speed device does not progress and almost of circuits for the very high speed device is composed only of the NPN transistors.

However, in the above-mentioned double balanced mixer circuit, there is a problem in that the circuit structure is complicated and the current consumption is great because the circuit is composed only of the NPN transistors.

SUMMARY OF THE INVENTION

Therefore, the present invention is accomplished in view of the problem as described above. An object of the present invention is to provide a double balanced mixer circuit in which PNP transistors are used so that power consumption can be reduced.

In order to achieve an aspect of the present invention, a double balanced mixer circuit includes two single balanced mixers each of which is composed of pair of first transistors, wherein output side terminals of the first transistors are cross-coupled between the two pairs, first differential signals are supplied to control terminals of the first transistors, a second transistor connected to each of the pairs of first transistors in series, and a differential amplifier circuit including a pair of third transistors and fourth transistors as constant current sources connected to the pair of third transistors, wherein second differential signals are supplied to control terminals of the third transistors and differential output terminals of the third transistors are directly coupled to control terminals of the second transistors, respectively. The terminals of the third transistors on the side of the fourth transistors are coupled to each other via a resistor.

In this case, at least one of the first to second transistors may be an NPN bipolar transistor or an N-channel MOS transistor. Also, at least one of the third and fourth transistors may be a PNP bipolar transistor or a P-channel MOS transistor when the second differential signals have frequencies equal to or lower than 20 MHz.

In the preferred embodiment, a double balanced mixer circuit includes a pair of first and second NPN transistors whose collectors are respectively connected to a power supply higher potential side line via first and second resistors. The collector of a third NPN transistor is connected to emitters of the first and second transistors in common and the emitter thereof is connected to a power supply lower potential line via a third resistor. A pair of fourth and fifth NPN transistors are respectively connected at their collectors to the power supply higher potential side line via the second and first resistors. The collector of a sixth NPN transistor is connected to emitters of the fourth and fifth transistors in common and the emitter thereof is connected to the power supply lower potential line via a fourth resistor. The emitters of seventh and eighth PNP transistors are respectively connected to the power supply higher potential line via fifth and sixth resistors and the collectors thereof are connected to each other via a seventh resistor. The emitters of ninth and tenth PNP transistors are respectively connected to the collectors of the seventh and eighth PNP transistors and the collectors thereof are respectively connected to the power supply lower potential line via eighth and ninth resistors and to bases of the third and sixth NPN transistors. A constant bias is supplied in common to the bases of the seventh and eighth PNP transistors. Baseband differential signals are respectively supplied to a set of bases of the first and fourth NPN transistors and a set of bases of the second and fifth NPN transistors, and local differential signals are respectively supplied to bases of the ninth and tenth PNP transistors.

DESCRIPTION OF THE PREFERRED EMBODIMENTS

The double balanced mixer circuit of the present invention will be described below in detail with reference to the accompanying drawings.

Figure 2:
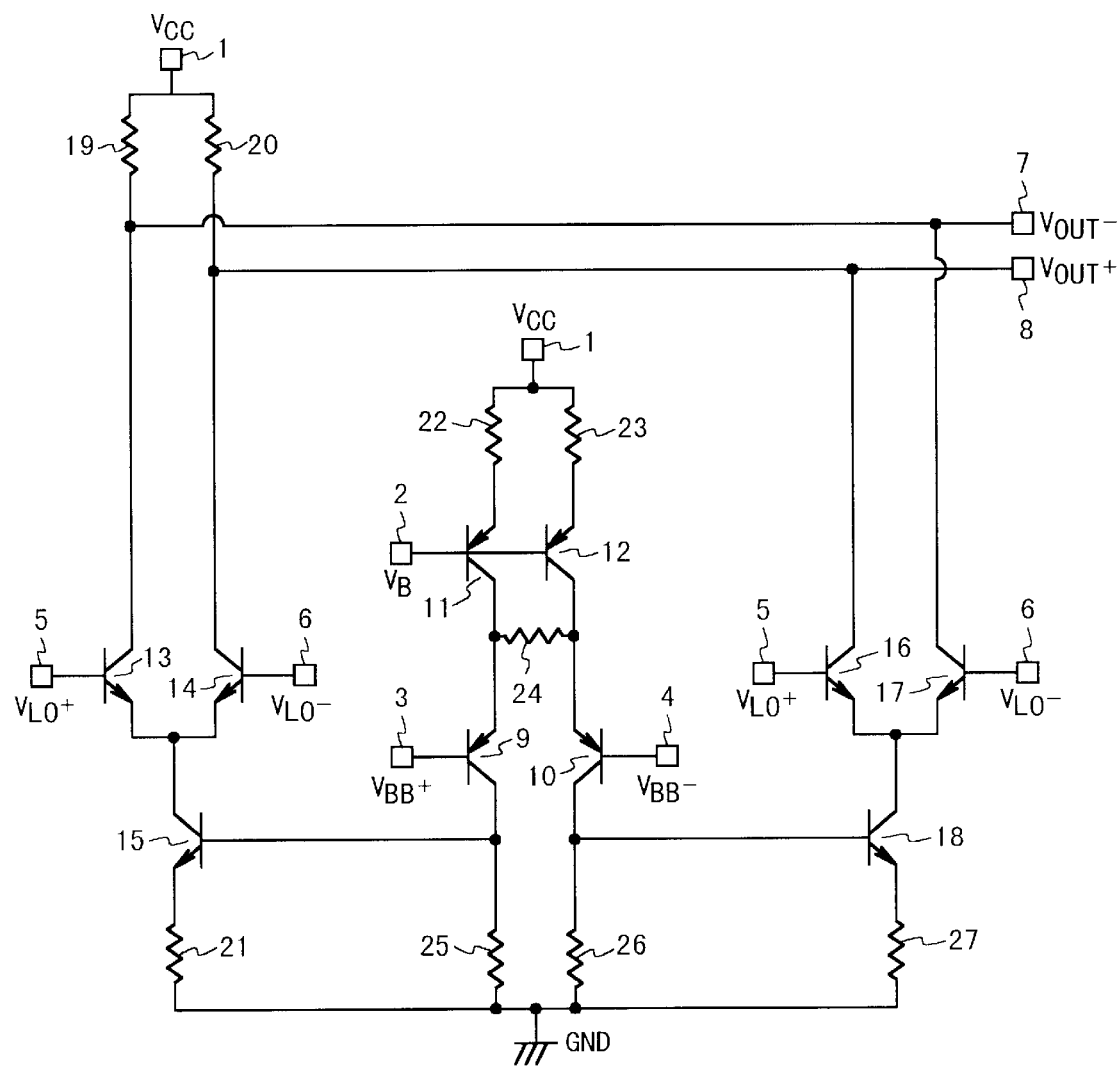
FIG. 2 is a circuit diagram illustrating the structure of a double balanced mixer circuit according to a first embodiment of the present invention.
Figure 3:
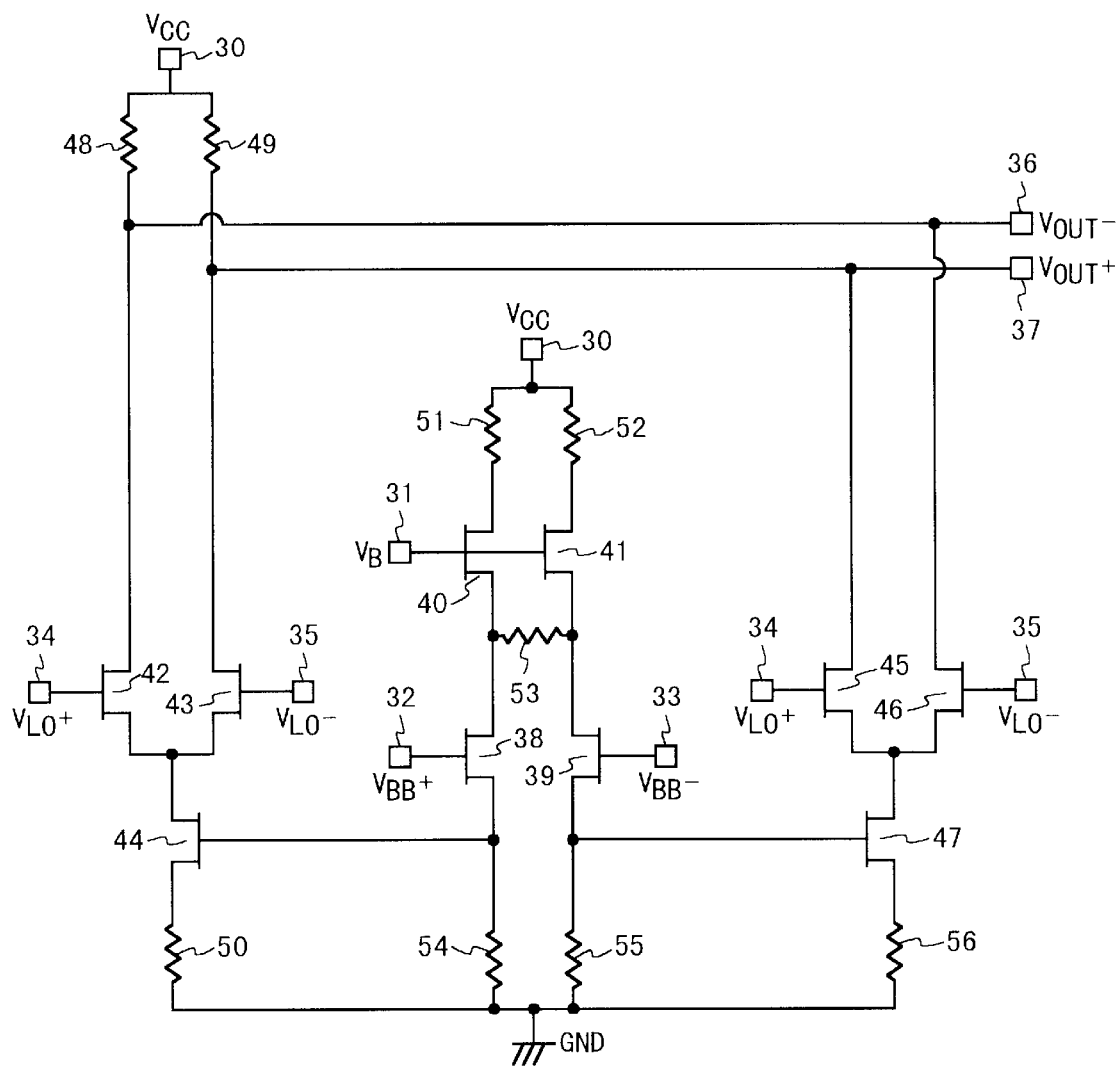
FIG. 3 is a circuit diagram illustrating the structure of the double balanced mixer circuit according to a second embodiment of the present invention.

FIG. 2 is a circuit diagram illustrating the structure of the double balanced mixer circuit according to first embodiment of the present invention. Referring to FIG. 2, in the double balanced mixer circuit according to the first embodiment, the differential pairs of NPN transistors (13 and 14; and 16 and 17) constitute single balanced mixer circuits, respectively. The collectors of the NPN transistors (13 and 14) are connected to a power supply terminal Vcc (1) via resistors (19 and 20), respectively. The collectors of NPN transistors (16 and 17) are connected to the collector of NPN transistors (14 and 13) in a cross-coupled manner. Also, the collectors of the NPN transistors (16 and 17) are connected to output signal terminals $V_{OUT}-$ (7) and $V_{OUT}+$ (8), respectively. Local differential signals are inputted to the bases of the transistors of each of the differential pairs from local differential signal terminals $V_{LO}+$ and $V_{LO}-$ (5 and 6), respectively.

There is provided a differential amplifier which is composed of PNP transistors (9 and 10). The emitters of the PNP transistors (9 and 10) are connected through a resistor (24). PNP transistors (11 and 12) connected to the emitters of the PNP transistors (9 and 10) function as constant current sources of the differential pair of transistors (9 and 10).

Next, the double balanced mixer circuit of the first embodiment of the present invention will be described in more detail.

The double balanced mixer circuit includes a differential amplifier in which the emitters of the PNP transistors Q3 and Q4 (11 and 12) are connected to the power supply terminal Vcc via resistors R4 and R5 (22 and 23), respectively. The bases as control terminals of the PNP transistors Q3 and Q4 (11 and 12) are connected to a bias voltage terminal $V_B$ (2).

The collectors of the PNP transistors Q3 and Q4 (11 and 12) are connected to each other via the resistor R3 (24). The PNP transistors Q3 and Q4 (11 and 12) act as constant current sources of the differential amplifier. Also, the collector of the PNP transistor Q3 (11) is connected to the emitter of the PNP transistor Q1 (9) and the collector of the PNP transistor Q4 (12) is connected to the emitter of the PNP transistor Q2 (10). The base of the transistor Q1 (9) is connected to the baseband signal terminal $V_{BB}+$ (3) and the base of the transistor Q2 (10) is connected to the baseband signal terminal $V_{BB}-$ (4). The collector of the transistor Q1 (9) as an output terminal is connected to a ground terminal GND via a resistor R7 (25) and the collector of the transistor Q2 (10) as an output terminal is connected to the ground terminal GND via a resistor R8 (26).

The double balanced mixer circuit further includes two single balanced mixer circuits. One single balanced mixer circuit is composed of a pair of NPN transistors Q5 (13) and Q6 (14). The collectors of the NPN transistors Q5 (13) and Q6 (14) are connected to the power supply voltage terminal Vcc (1) via resistors R1 (19) and R2 (20), respectively. The base of the transistor Q5 (13) is connected to the local signal terminal $V_{LO}+$ (5) and the base of the transistor Q6 (14) is connected to the local signal terminal $V_{LO}-$ (6). The emitters of the NPN transistors Q5 (13) and Q6 (14) are connected in common and to the collector of an NPN transistor Q7 (15). The emitter of the NPN transistor Q7 (15) is connected to the ground terminal GND via a resistor R3 (21). The base of the NPN transistor Q7 (15) is connected to the collector of the PNP transistor Q1 (9). The other single balanced mixer circuit is composed of a pair of NPN transistors Q8 (16) and Q9 (17). The collectors of the NPN transistors Q8 (16) and Q9 (17) are connected to the collectors of the NPN transistors Q6 (14) and Q5 (13) in a cross-coupled manner and the output signal terminals $V_{OUT}+$ (8) and $V_{OUT}-$ (7), respectively. The base of the transistor Q8 (16) is connected to the local signal terminal $V_{LO}+$ (5) and the base of the transistor Q9 (17) is connected to the local signal terminal $V_{LO}-$ (6). The emitters of the NPN transistors Q8 (16) and Q9 (17) are connected in common and to the collector of the NPN transistor Q10 (18). The emitter of the NPN transistor Q10 (18) is connected to the ground terminal GND via a resistor R9 (27). The base of the NPN transistor Q10 (18) is connected to the collector of the PNP transistor Q2 (10).

In this manner, the double balanced mixer circuit including the two single balanced mixer circuits is constituted.

In the double balanced mixer circuit according to the first embodiment of the present invention, the differential baseband signals are supplied from the terminals $V_{BB}+$ (3) and $V_{BB}-$ (4). The differential baseband signals are amplified by the differential amplifier which is composed of the PNP transistors and directly supplied from the collectors as the output terminals of the PNP transistors Q1 (9) and Q2 (10) to the bases of the NPN transistors Q7 (15) and Q10 (18). Also, the differential local signals are supplied to the terminals $V_{LO}+$ (5) and $V_{LO}-$ (6). The local signal and the baseband signal are mixed and are amplified by the single balanced mixer which is composed of the NPN transistors Q5 (13), Q6 (14) and Q7 (15) and the single balanced mixer which is composed of the NPN transistors Q8 (16), Q9 (17) and Q10 (18). Then, the signals that the local signal and the baseband signal were mixed are output from the output signal terminals $V_{OUT}-$ (7) and $V_{OUT}+$ (8).

Figure 4:
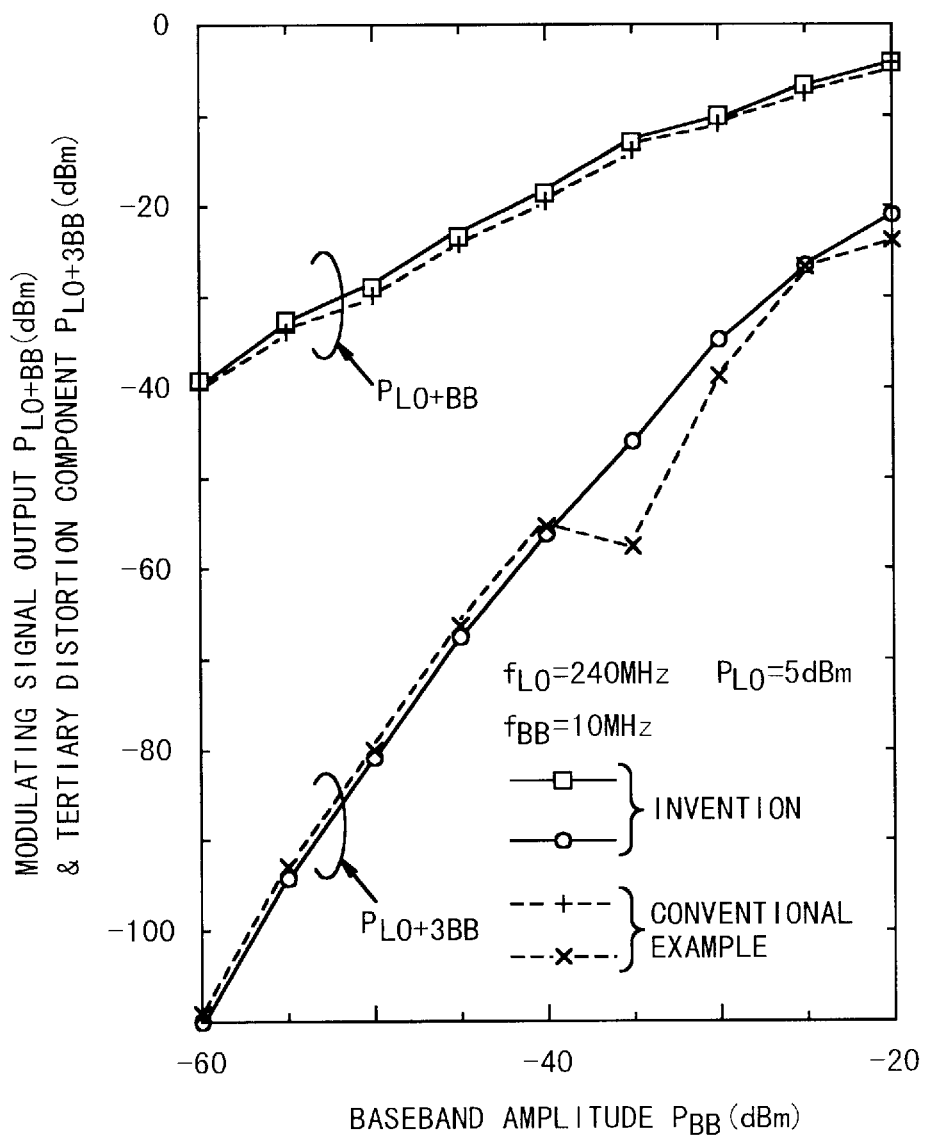
FIG. 4 is a graph showing relations of baseband amplitude to modulating signal output and tertiary distortion component in the double balanced mixer circuit according to first embodiment of the present invention and the conventional double balanced mixer circuit shown in FIG. 1.
Figure 5:
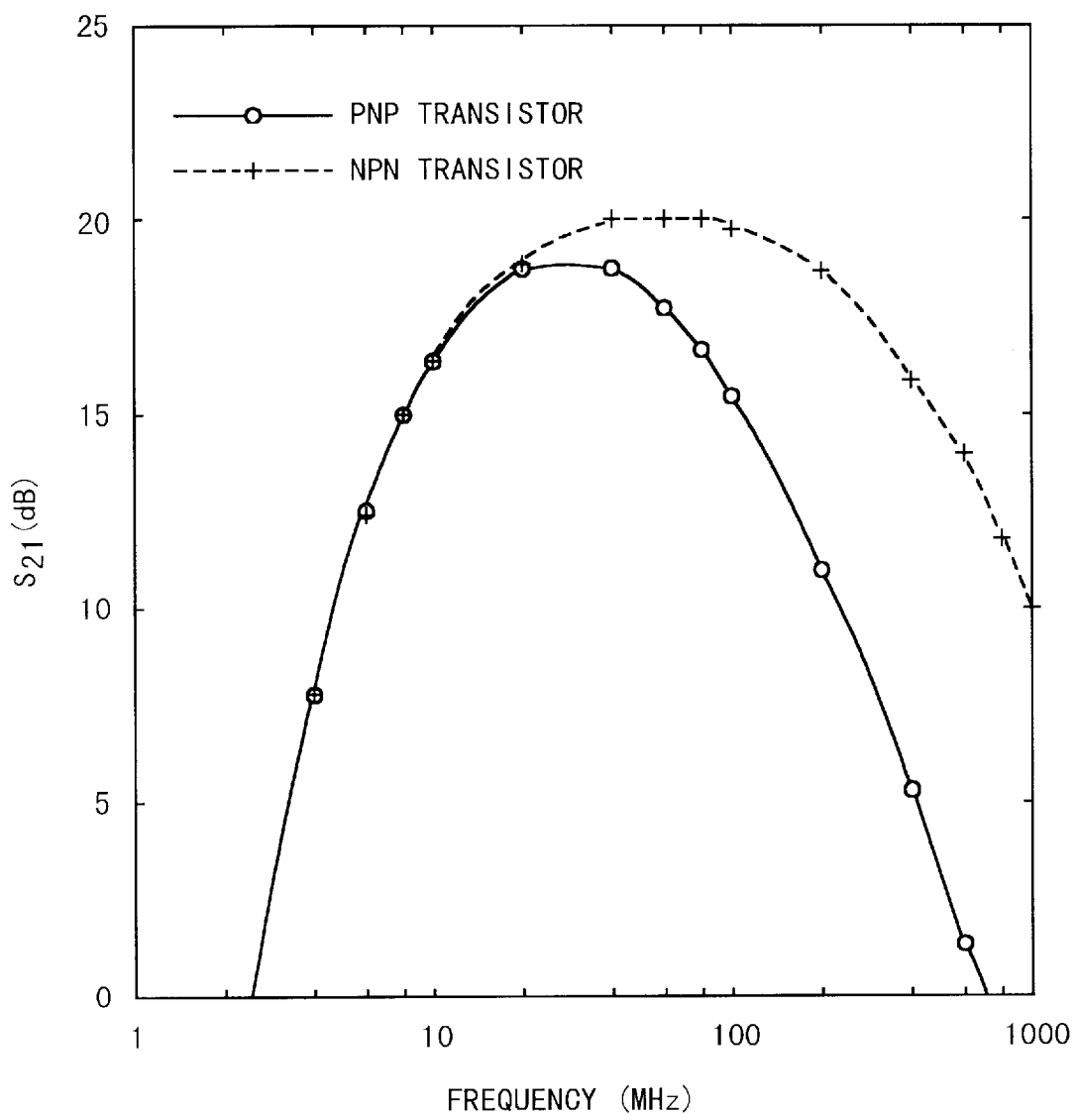
FIG. 5 is a graph showing the small signal gain characteristic S21 of an NPN transistor and PNP transistor.

FIG. 5 shows the small signal gain $S_{21}$ characteristics of the NPN transistor and PNP transistor. Both graphs indicate the results of simulation when emitter-collector voltage $V_{CE}=1$ V and collector current $I_c=4.5$ mA. As seen from FIG. 4, the $S_{21}$ characteristics of the NPN transistor and PNP transistor are coincident in a frequency range to about 20 MHz. The $S_{21}$ characteristic of the PNP transistor is inferior to that of the NPN transistor in a frequency range above 20 MHz. Because the signal frequency of the baseband signal is typically a low frequency signal in a range from hundreds of Kilo Hertzes (KHz) to several Mega Hertzes (MHz) in case of the quadrature modulator, the differential amplifier for amplifying the baseband signal is not necessary to be composed of the NPN transistors as in the conventional example. If the differential amplifier is composed of the PNP transistors, the two emitter followers which are used in the above conventional circuit can be removed.

Figure 1:
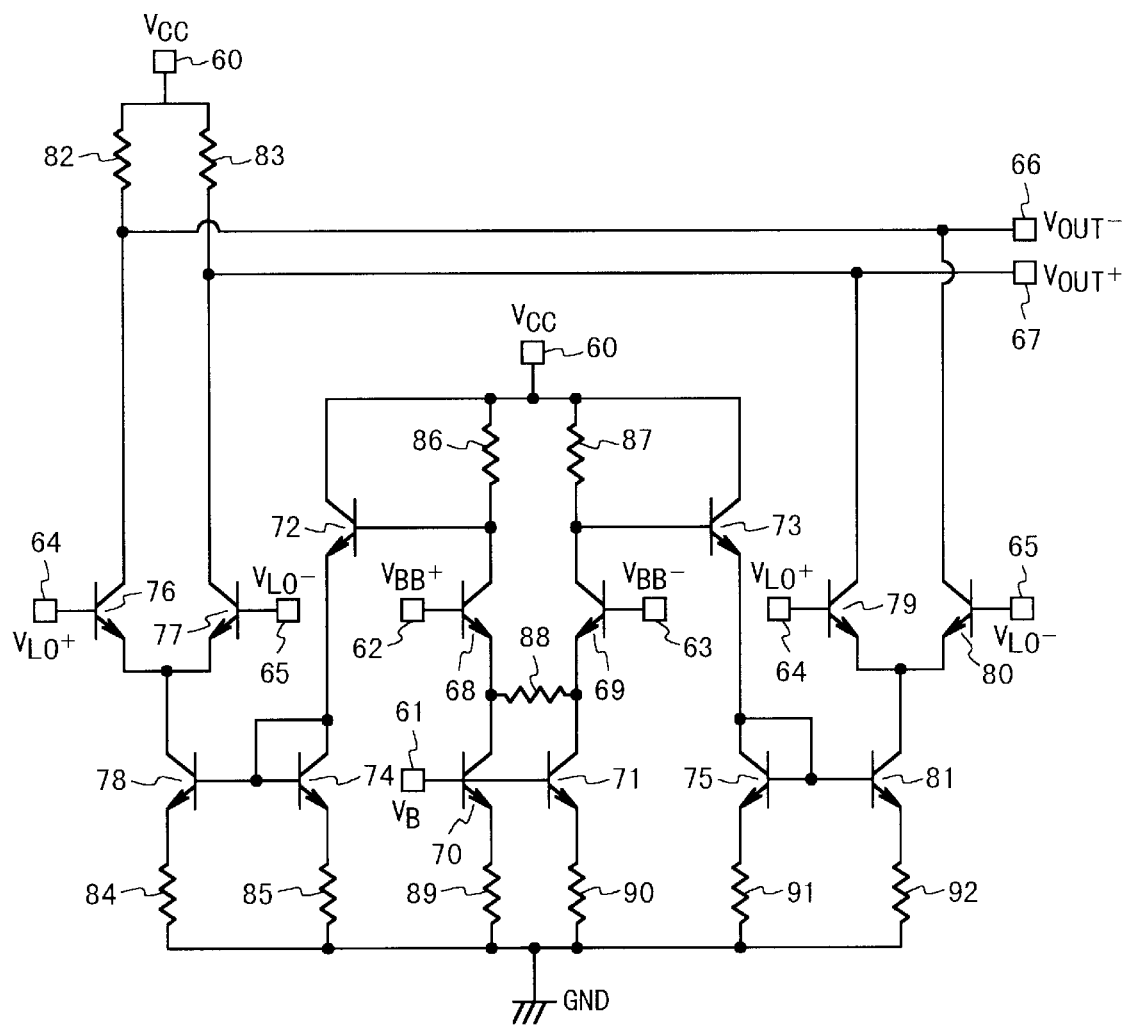
FIG. 1 is a circuit diagram illustrating the structure of a conventional double balanced mixer circuit.

FIG. 4 shows the simulation results on the double balanced mixer circuit according to the first embodiment of the present invention and the above conventional example shown in FIG. 1. The baseband amplitude vs the modulating wave signal output $(P_{LO+BB})$ characteristics which are shown by "+" and "☐" and the tertiary distortion component $(P_{LO+3BB})$ which are shown by "x" and "701" are indicated on the conventional example and this embodiment. In the conventional double balanced mixer circuit shown in FIG. 1, the results shown in FIG. 4 by "+" and "x" were obtained in the power supply voltage Vcc of 3 V and a total current Icc of 79.1 mA. On the other hand, in the double balanced mixer circuit according to the first embodiment of the present invention, substantially the same simulation results as those of the conventional example were obtained in the power supply voltage Vcc of 3 V and a total current Icc of 41.4 mA. In this manner, the power consumption can be reduced by about 21%, compared to the case of the conventional example.

Next, FIG. 2 is a circuit diagram illustrating the structure of the double balanced mixer circuit according to the second embodiment of the present invention. In this embodiment, MOS FETs (metal-oxide-semiconductor field effect transistors) such as GaAs FETs for high frequency are used in place of the bipolar transistors in the above-mentioned first embodiment. The first and the second FETs (38 and 39) which constitute the differential amplifier and the third and fourth FETs (40 and 41) which constitute the constant current source of the differential amplifier has source terminals on the side of the power supply higher potential. The fifth to seventh FETs (42, 43 and 44) which constitute a single balanced mixer and the eighth to tenth FETS (45, 46 and 47) which constitute another single balanced mixer have drain terminals on the side of the power supply higher potential. As a result, the low power supply voltage-type double balanced mixer circuit can be obtained as in the above-mentioned first embodiment.

As described above, according to the present invention, the differential amplifier to which the baseband signal is inputted is composed of the PNP transistors, so that the two emitter follower circuits which are used in the conventional example can be reduced. Therefore, the consumption current can be reduced by about 21%. Also, according to the present invention, the low power supply voltage-type double balanced mixer circuit can be achieved using FETs.

What is claimed is:

1. A double balanced mixer circuit comprising:
   two single balanced mixer circuits each of which is composed of a pair of first transistors, wherein output side terminals of said first transistors are cross-coupled between said two pairs, first differential signals are supplied to control terminals of said first transistors;
   a pair of second transistors, with each second transistor of said pair of second transistors connected in series to one of said pairs of first transistors; and a differential amplifier circuit including a pair of third transistors, and fourth transistors as constant current sources connected to said pair of third transistors, second differential signals are supplied to control terminals of said third transistors and differential output terminals of said third transistors are directly coupled to control terminals of said pair of second transistors, respectively.

2. A double balanced mixer circuit according to claim 1, wherein said first transistors are NPN bipolar transistors.

3. A double balanced mixer circuit according to claim 1, wherein said pair of second transistors are NPN bipolar transistors.

4. A double balanced mixer circuit according to claim 1, wherein said first transistors are N-channel MOS transistors.

5. A double balanced mixer circuit according to claim 1, wherein said pair of second transistors are N-channel MOS transistors.

6. A double balanced mixer circuit according to claim 1, wherein said third transistors are PNP bipolar transistors.

7. A double balanced mixer circuit according to claim 1, wherein said third transistors are P-channel MOS transistors.

8. A double balanced mixer circuit according to claim 1, wherein said fourth transistors are PNP bipolar transistors.

9. A double balanced mixer circuit according to claim 1, wherein said fourth transistors are P-channel MOS transistors.

10. A double balanced mixer circuit according to claim 1, wherein said second differential signals have frequencies equal to or lower than 20 MHz.

11. A double balanced mixer circuit according to claim 1, wherein terminals of said third transistors on the side of said fourth transistors are coupled to each other via a resistor.

12. A double balanced mixer circuit according to claim 1, wherein said pair of first transistors and said second transistor connected to said pair of first transistors in series are provided between power supply lines and said differential amplifier circuit is provided between said power supply lines.

13. A double balanced mixer circuit comprising:

a pair of first and second NPN transistors whose collectors are respectively connected to a power supply higher potential side line via first and second resistors;

a third NPN transistor whose collector is connected to emitters of said first and second transistors in common and whose emitter is connected to a power supply lower potential line via a third resistor;

a pair of fourth and fifth NPN transistors whose collectors are respectively connected to said power supply higher potential side line via said second and first resistors;

a sixth NPN transistor whose collector is connected to emitters of said fourth and fifth transistors in common and whose emitter is connected to said power supply lower potential line via a fourth resistor;

seventh and eighth PNP transistors whose emitters are respectively connected to said power supply higher potential line via fifth and sixth resistors and whose collectors are connected to each other via a seventh resistor; and ninth and tenth PNP transistors whose emitters are respectively connected to said collectors of said seventh and eighth PNP transistors and whose collectors are respectively connected to said power supply lower potential line via eighth and ninth resistors and to bases of said third and sixth NPN transistors, and wherein a constant bias is supplied in common to bases of said seventh and eighth PNP transistors, first differential signals are respectively supplied to a set of bases of said first and fourth NPN transistors and a set of bases of said second and fifth NPN transistors, and second differential signals are respectively supplied to bases of said ninth and tenth PNP transistors.

14. A double balanced mixer circuit according to claim 13, wherein said second differential signals have frequencies equal to or lower than 20 MHz.

15. A double balanced mixer circuit according to claim 13, wherein at least one of said NPN transistors each having said emitter, base and collector is replaced by an N-channel MOS transistor having a source, gate and drain.

16. A double balanced mixer circuit according to claim 13, wherein at least one of said PNP transistors each having said emitter, base and collector is replaced by a P-channel MOS transistor having a source, gate and drain.

* * * * *

UNITED STATES PATENT AND TRADEMARK OFFICE
CERTIFICATE OF CORRECTION

PATENT NO. : 5,805,987
DATED : September 8, 1998
INVENTOR(S) : Fumihiro Kamase

It is certified that error appears in the above-identified patent and that said Letters Patent is hereby corrected as shown below:

Title page, item [73], Assignee: insert Croporation, Tokyo, Japan--.

Signed and Sealed this

Twenty-fifth Day of July, 2000

Attest:

Q. TODD DICKINSON

Attesting Officer

Director of Patents and Trademarks

UNITED STATES PATENT AND TRADEMARK OFFICE
CERTIFICATE OF CORRECTION

PATENT NO. : 5,805,987
DATED : September 8, 1998
INVENTOR(S) : Fumihiro Kamase

It is certified that error appears in the above-identified patent and that said Letters Patent is hereby corrected as shown below:

Title page, item [73], Assignee: insert --NEC Corporation, Tokyo, Japan--

This certificate supersedes Certificate of Correction issued July 25, 2000.

Signed and Sealed this

Twelfth Day of September, 2000

Attest:

Q. TODD DICKINSON

*Attesting Officer*   *Director of Patents and Trademarks*